United States Patent [19]

Polhemus

[11] Patent Number: 5,444,410

[45] Date of Patent: Aug. 22, 1995

[54] CONTROLLED-TRANSITIONI-TIME LINE DRIVER

[75] Inventor: Gary D. Polhemus, Limerick, Me.

[73] Assignee: National Semiconductor Corporation, Sant Clara, Calif.

[21] Appl. No.: 85,583

[22] Filed: Jun. 30, 1993

[51] Int. Cl.$^6$ .................... H03K 5/08; H03K 17/687; H03M 11/00

[52] U.S. Cl. .................... 327/317; 327/103; 327/437

[58] Field of Search ............ 307/261, 264, 571, 584; 327/310, 437, 563, 103, 317, 391, 384, 376, 377, 24, 26, 83

[56] References Cited

U.S. PATENT DOCUMENTS

| | | | |
|---|---|---|---|
| 3,983,493 | 9/1976 | Gladstone | 307/261 |
| 5,055,720 | 10/1991 | Teede | 307/264 |
| 5,084,632 | 1/1992 | Shenbara | 307/264 |
| 5,089,728 | 2/1992 | Nguyen | 307/572 |

FOREIGN PATENT DOCUMENTS

| | | | |
|---|---|---|---|
| 4139997 | 7/1992 | Germany | 307/571 |
| 228124 | 9/1990 | Japan | 307/571 |

*Primary Examiner*—William L. Sikes
*Assistant Examiner*—Tiep H. Nguyen
*Attorney, Agent, or Firm*—Thomas L. Bohan

[57] ABSTRACT

A MOS-based current-switch/driver multiplexed and coupled with a tapped delay line so as to form a generator for transmitting on unshielded, unfiltered transmission lines highly-symmetric data pulses displaying minimal transient aberrations and minimal common-mode noise. The switch/driver is a basic differential current switch incorporating two MOS output transistors controlled by a novel switching means. The novel switching means ensures the symmetry of the output signals by compensating for the turn-on/turn-off asymmetries inherent in MOS transistors. The compensation is provided by the control circuit interposed between the switch/driver inputs and the control gates of the output transistors, a control circuit which includes deliberately-skewed CMOS inverters and a pair of MOS driver-transistors associated with each output transistor. The output signals from these current generators are referenced to ground. Transient aberrations are largely eliminated in this invention by lengthening the rise and fall times of the transmitted pulses. A tapped delay line is used in conjunction with a plurality of the new switch/-drivers in order to form and transmit composite pulses with rise/fall significantly greater than the natural rise-times and fall-times of the individual switches (about 0.6 nsec).

9 Claims, 10 Drawing Sheets

CONTROLLED-TRANSITIONI-TIME LINE DRIVER

BACKGROUND OF THE INVENTION

1. Field of the Invention

The invention relates to driver circuits, and in particular to features of driver circuits directed to the control of harmonic content, common-mode noise, and reflective losses in the driver output. More particularly, the invention relates to controlling transient aberrations and reflections in data pulses transmitted by a current-switch/driver to a data-transmission line. Even more particularly, the invention relates to minimizing transient aberrations and signal reflections as part of and in addition to the minimization of electromagnetic-interference (EMI) arising from high-frequency (>50 Mhz) data transmission over unshielded metal conductors.

2. Prior Art

Great advantages attach to high-frequency data transmission and in particular to such transmission on unshielded transmission lines such as the twisted pairs of copper wires often used to couple local area computer networks. Unfortunately, the high-frequency pulses making up the data give rise to unacceptable levels of EMI and also suffer impedance-mismatch losses—problems which worsen as the transmission frequency increases. Major sources of EMI are: (a) common-mode noise on the transmission line arising from (i) capacitive coupling of the transmitter output to its input and intermediate nodes and (ii) noise on the power rail forming the common reference for the output signals, (b) ringing and overshoot (collectively, "transient aberrations") of the pulses, and (c) asymmetries between the pulses' rising and falling edges. Generally stated, the condition for having no EMI from the transmission line requires that the line not give rise to any alternating (ac) electromagnetic field at a distance. Since the transmission line is supposed to carry both a signal and the complement of that signal, in theory the problem does not exist; the field at a distance arising from the signal should be equal in magnitude and opposite in phase to the field at a distance arising from the signal complement and hence the superposition of these two fields should lead to an ac nullity. Stated differently, at a distance from a twisted pair of conductors carrying a signal and a signal complement, respectively, the ac electromagnetic field of the two conductors will appear to be zero because of cancellation of two equal-magnitude/opposite-phase ac signals. Now, anything that breaks the signal/signal-complement anti-symmetry will lead to a non-vanishing ac electromagnetic field at a distance and hence to EMI at a frequency comparable to the signal frequency. This occurs, for example, if both signals are referenced to a source that is itself time-varying. It also occurs if, through capacitive coupling or other means, a time-varying signal is fed onto one or both conductors of the transmission line pair. It occurs in an especially detrimental fashion if there is ringing and/or overshoot at the pulse edges. (These transient aberrations cannot cancel out and they provide a net signal which is both of high amplitude and of extremely high frequency.) Non-vanishing ac fields-at-a-distance also occur if the falling edge of the pulse is not symmetric with the rising edge. E.g., if the rising edge is steeper than the falling edge, then the rising pulse on the signal line added to the corresponding falling pulse on the complement signal line yields a non-zero signal which varies with time.

These various signal problems giving rise to EMI are inherent in the prior-art drivers; attempts to minimize them generally have been limited to introducing LRC filters on the transmission line near where it couples with the transmitter and receiver. (In addition, choke coils and isolator transformers typically are used at both ends of the transmission line.)

Unfortunately, the LRC filters introduced in the prior art to address the EMI and impedance mismatch problems associated with high-frequency transmission introduce problems of their own. These include but are not limited to signal dispersion and ringing. Because the LRC filters employed with the prior art are of limited band width, they are unable to adequately reduce EMI and reflective losses across the entire signal bandwidth no matter how well they are tuned to do the job at the fundamental carrier frequency. Frequencies of interest at the present level of development are on the order of 62.5 MHz; rise and fall times of the pulses making up the data trains of interest are on the order of 600 picoseconds. It is this very fast rise/fall time that leads to the EMI-generating transient aberrations. The LRC filters are particularly ineffective in addressing the transient aberration problems at these high frequencies and can in fact exacerbate them. A final consideration is that circuitry conveying pulses with extremely fast rise- and fall-times is very unforgiving—in the sense that a junction adequate for lower frequencies can be the site of significant ringing at the high frequencies implicit in such short rise/fall times. A high premium attaches to the care with which intra-circuit connections are made if the circuit is going to be carrying such signals. This need can be relaxed somewhat if the rise/fall time can be lengthened (within the constraints implicit in the underlying transmission frequency, on the order of 62.5 MHz and higher).

FIG. 1 shows a typical prior-art system incorporating an ECL switch/driver as the transmitter—with output $V_o$ and complementary output $V_oB$. (The inset FIG. 1a shows the ECL switch/driver in detail.) LRC filters—F1 and F2—are placed on the transmission line to reduce the EMI and to provide impedance matching. In addition, choke coils T2 and T4 are shown, along with isolation transformers T1 and T3. The choke coils are used to reduce common-mode noise. It can be seen from the ECL circuit constituting the switch/driver that any noise picked up by the high-potential power rail $V_{cc}$ will be imposed on both members of the transmission-line pair, $V_o$ and $V_oB$. In general this will be high-frequency noise and so will contribute to the EMI problem. It would be preferable to have the output and the output complement referenced to the low-potential power rail GND rather than to $V_{cc}$; it is the nature of the GND rail to be more tightly coupled to the external reference and consequently less susceptible to pick-up than is the $V_{cc}$ rail. It is, however, in the nature of the ECL drivers that the output signals are referenced to $V_{cc}$.

By shifting to a MOS-based switch/driver, it is possible to generate current pulses referenced to the low-potential power rail GND. FIG. 2a depicts a prior-art MOS switch/driver analogous to the ECL circuit of FIG. 1. The current $I_M$ to be switched between the two branches is fixed by some known means represented by the current regulator/generator symbol in the line running from the high-potential power rail $V_{cc}$ to the common source nodes of the PMOS output transistors QA and QB. The output transistors QA and QB are switched by the CMOS inverter stages coupled between $V_{cc}$ and GND and controlled by the input and complementary input signals, E and EB, respectively. These are standard CMOS inverters with the relative sizes of the PMOS and NMOS devices skewed so as to provide symmetric output signals to the gates of QA and QB in response to symmetric input signals at E and EB, respectively. (The skewing involves making the PMOS channel wider than the NMOS channel. The degree to which this must be done depends on the particular process used to fabricate the device; for a typical prior art process, symmetric CMOS input signals generate symmetric CMOS output signals if the P-Channel is three times the width of the N-Channel.) With this arrangement, the control gate of each driver transistor is pulled to either $V_{cc}$—which cuts the driver transistor completely off—or to GND, which turns it fully on. Thus, the entire current $I_M$ either passes through QA and to ground through the resistor coupling the QA drain to GND—making $V_o=I_M(R_o/2)$ and $V_oB=$GND—or it passes through QB to GND resulting in the opposite signals to the transmission lines. This circuit has the advantage from the standpoint of common-mode noise reduction that $V_o$ and $V_oB$ are referenced to the more stable power rail, GND.

In addition to $V_{cc}$ fluctuation, another major source of common-mode noise is capacitive coupling of the input signal to other nodes of the switch/driver. With reference to FIG. 1, such coupling between the base nodes of transistors QX and QY, respectively, and the outputs $V_o$ and $V_oB$ will generate common-mode noise of the same high frequency as the input. Regardless of the particular driver circuit involved, there is a certain minimum input/output capacitive coupling which cannot be eliminated. Once that level is approached, efforts at further reduction in this component of common-mode noise must look to minimizing the voltage swing of the input signals themselves. With the ECL switch circuit depicted in FIG. 1, the minimum swing must be enough to turn the npn transistors on and off completely. I.e., for a good on/off ratio at the driver output, the constant tail current $I_f$ must pass completely through QX or completely through QY. This requires a minimum input swing at E and EB of about 0.3 V, though the swing used in actual practice is more like 0.8 V.

With respect to minimization of the input swing, the MOS-based driver is not as good as the ECL unit; frequently a full rail-to-rail swing is used for switching MOS transistors. This can be seen to be the case with the circuit of FIG. 2a. It can also be seen from FIG. 2a that it is overkill to use a full rail-to-rail voltage swing to switch QA and QB on and off. All that is really necessary for QA shut-off is that its gate be at a voltage greater than $V_s-V_T$, where $V_s$ is the common source voltage in this circuit and $V_T$—is the threshold source—gate voltage for turning on the MOS transistor QA. The specific value of the common source voltage depends on the exact nature of the circuit sourcing $I_M$ and the gain of the member of the QA, QB pair which is conducting. In any event, this means that biasing the gate of QA, for example, to the common source voltage—i.e., making $V_{gs}=0$ for QA—will certainly ensure that QA is non-conducting. Similar remarks follow for QB.

FIG. 2b shows the prior-art switch/driver of FIG. 2a with a particular current-sourcing mechanism selected, namely a PMOS transistor Q7 operating in its saturation mode and with its gate biased by an off-chip-generated $V_{BIAS}$ so as to establish by known means a mirrored current $I_M$ independent of operating temperature, power supply voltage, and vagaries in the process by which the chip was manufactured. With this particular means for regulating the current to be switched, it is possible and desirable to interpose PMOS transistors (QC and QD) between the CMOS stages and $V_{cc}$. This ensures that the "turn-off" voltage applied to the QA and QB control nodes makes $V_{gs}$ approximately zero, and that the voltage swing is reduced by the drop across QC (or QD) when it is conducting. This reduction in input swing voltage significantly reduces the high frequency noise capacitively coupled onto the transmission line. (The ringing and overshoot problems, however, still remain, since they are associated with the fast rise/fall time, which exists for the MOS-based circuit as for the ECL circuit.)

Another problem needs to be overcome in order to reap the common-mode noise advantages of the MOS-based switch/driver; it relates to signal shape and the complicated way in which the conduction current of a MOS transistor varies in response to the voltage applied at its gate node, particularly in contrast to the simple response curve of bipolar transistors. That is, unlike the simple transfer function—$K\tanh(V_{IN}/V_T)$—describing the switching of the bipolar pair of FIG. 1 as a function of control node voltage $V_{IN}$, the transfer function describing the MOS differential pair is quite complicated, involving as it does several modes of transistor operation. For example, the "turning-on" device may be in its saturation region while the "turning-off" device is in its subthreshold—weak inversion—region. This means that the incremental current-changes in the MOS device turning on will not match in magnitude the simultaneous current changes in the device turning off. The result is that for symmetric input pulses at E and EB (and consequently, by design, symmetric pulses at the control nodes of QA and QB in accordance with FIG. 2a and FIG. 2b), the output current pulses through the resistors Ro/2 in the circuits depicted in FIG. 2a and FIG. 2b will not be symmetric; in particular, the rising edge of the turning-on current pulse will be qualitatively different from the falling edge of the turning-off current pulse. This is a problem which must be resolved in any MOS-based switch/driver to be used in a situation where EMI is a concern.

As noted above, going to the MOS-based switch/driver does not resolve the transient aberration problem. It arises in both the ECL-based and MOS-based prior art from the extremely short switching time of these circuits—a switching time, as indicated, on the order of 0.6 nsec. Fortunately, it is only necessary to lengthen this time by a factor of three or so to practically eliminate the transient aberrations. (Since, at the transmission frequencies in question—about 62.5 MHz—the pulse length itself is on the order of 8 nsec, lengthening the rise/fall time to 2 nsec leaves a sufficient "eye" for the pulses to be processed by the receiver.) Unfortunately, lengthening the rise/fall time turns out to be a fix more easily prescribed than done. For example, extending the rise/fall time by placing an RC time constant (capacitive low-pass filter) at the output of the switch/driver is unacceptable because of the resulting changes in the transmitter's output impedance—a serious concern because of the reflective losses which result from impedance mismatch at these frequencies.

Therefore, what is needed is a high-frequency switch/driver which generates current pulses referenced to the low-potential power rail, a switch/driver that can transmit current pulses symmetric in their rising and falling edges in response to symmetric input voltages at E and EB. What is also needed is that such a switch/driver be able to produce output pulses with a good "on" to "off" ratio in response to a minimal input voltage swing. Finally, what is needed is a means of increasing the rise- and fall-times of the generated pulses without degrading the output impedance of the switch/drivers producing the pulses.

SUMMARY OF THE INVENTION

The present invention is a circuit and method for transmitting high-frequency data pulses referenced to a low-potential power rail. Part of the circuit is a MOS-based differential current-switching circuit incorporating an output-transistor-control-circuit for overcoming the pulse asymmetries usually introduced by MOB transistors. This ensures symmetric current pulses at the output in response to symmetric voltage pulses at the input. The output-transistor-control-circuit of the present invention also effects a swing-voltage reduction and a consequent reduction of the capacitive coupling of input signals onto the output nodes. Finally, the new switch/drivers (current generators) of the present invention are ganged together and coupled to a tapped delay line so as to be capable of producing a composite output pulse with ramped rise- and fall-times long enough to largely eliminate transient aberrations on the transmission line and at other junctures of the transmission circuit. By using this composite approach, the present invention avoids degrading the output impedance of the signal generator while transmitting digital data at high frequencies without significant EMI and without the use of LRC filtering on the transmission line.

The use of an array of current switches is a standard method for producing a scalable driver and is usually recommended for physical layout reasons. The natural parasitic skew between switching elements is usually considered to be a problem. This invention exploits the natural skewing which results from deliberately increasing—in a controlled fashion—the time skew between the individual switch elements. I.e., the input capacitance of the switch/drivers is used as the capacitance for the RC delay line on the input. The result is a synthesized waveshape accomplished without additional power and with only minimal additional layout requirements.

Conclusion

Coupling an array of the new balanced current switch/drivers to a tapped delay line yields a well-controlled transition time, low common mode noise, and minimal reflections, all attained without the use of the extended filters currently required. The resulting circuit has broad applications in high frequency analog signal production and is specifically applicable to driving twisted-pair transmission lines used in high-speed digital communication systems. The combination can be employed using a common VLSI CMOS process and is scalable to different minimum channel length geometries.

PREFERRED EMBODIMENT OF THE INVENTION

Figure 7:
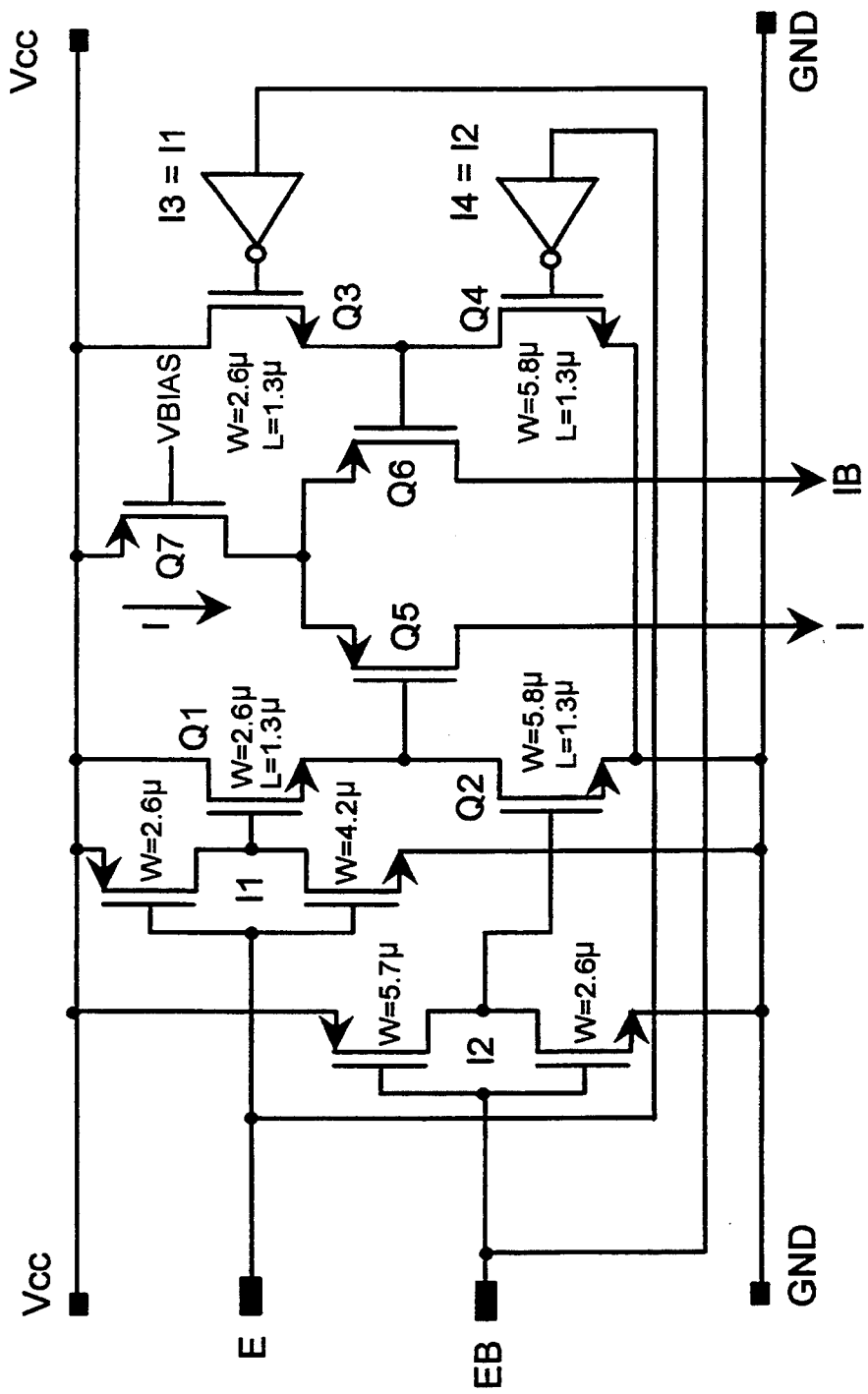
FIG. 7 The individual switch/driver according to the Preferred Embodiment of the present invention.

FIG. 7 depicts the Preferred Embodiment of the MOS Balanced Switch and Line Driver of the present invention. The current-to-be-switched is established by the PMOS transistor Q7 operating in its saturation range and biased by a voltage generated outside this circuit so as to provide a Q7 drain current independent of operating temperature, power supply voltage, and chip-manufacturing variations. The CMOS stages constituting inverters I1 and I2, respectively, are shown explicitly. A more general illustration of the invention is shown in FIGS. 3a and 3b and described briefly herein.

The Individual Switch/Driver

Figures 1, 1A:
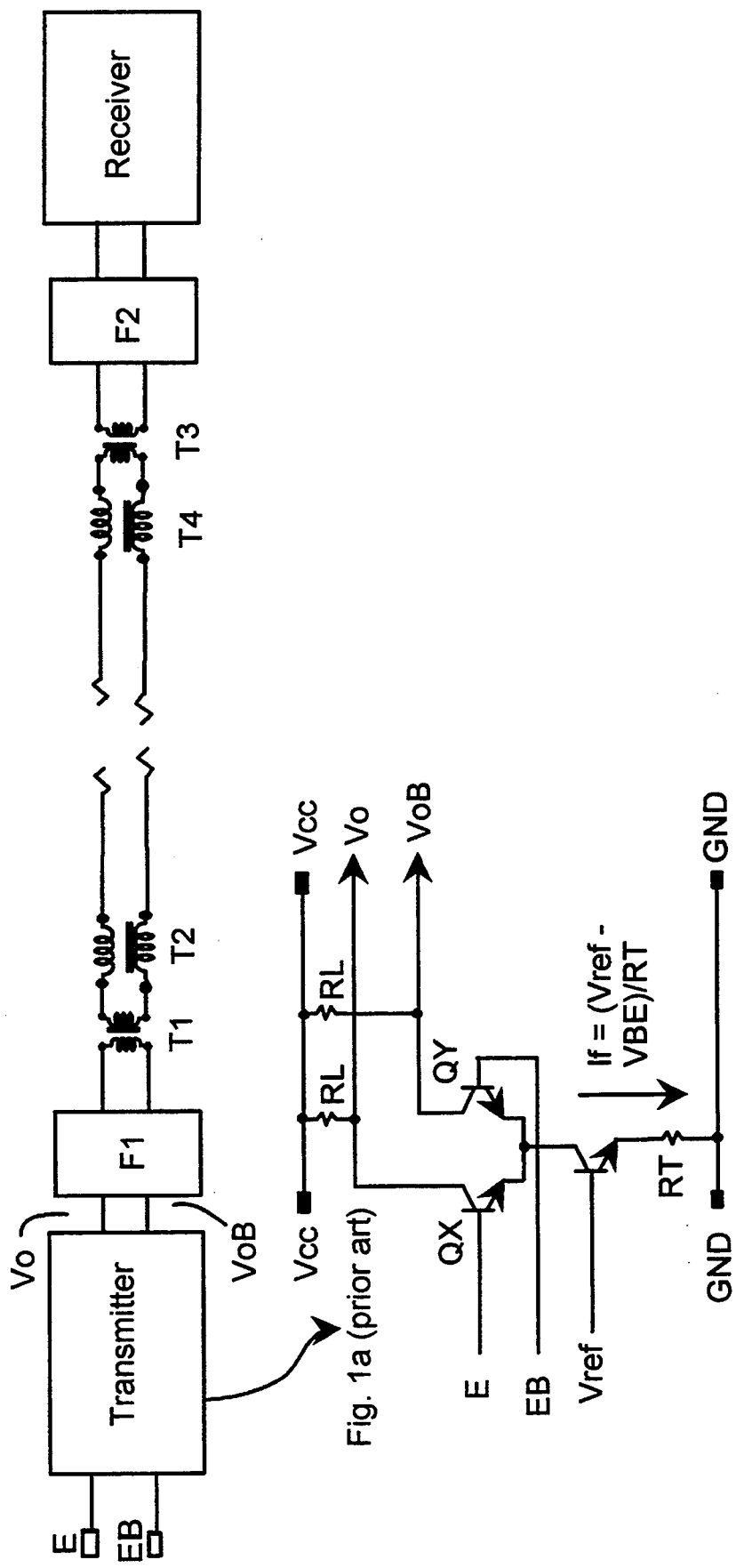
FIG. 1 (prior art) Schematic depiction of prior art transmission line utilizing an ECL switch/driver as the transmitter's output stage.
Figure 2A:
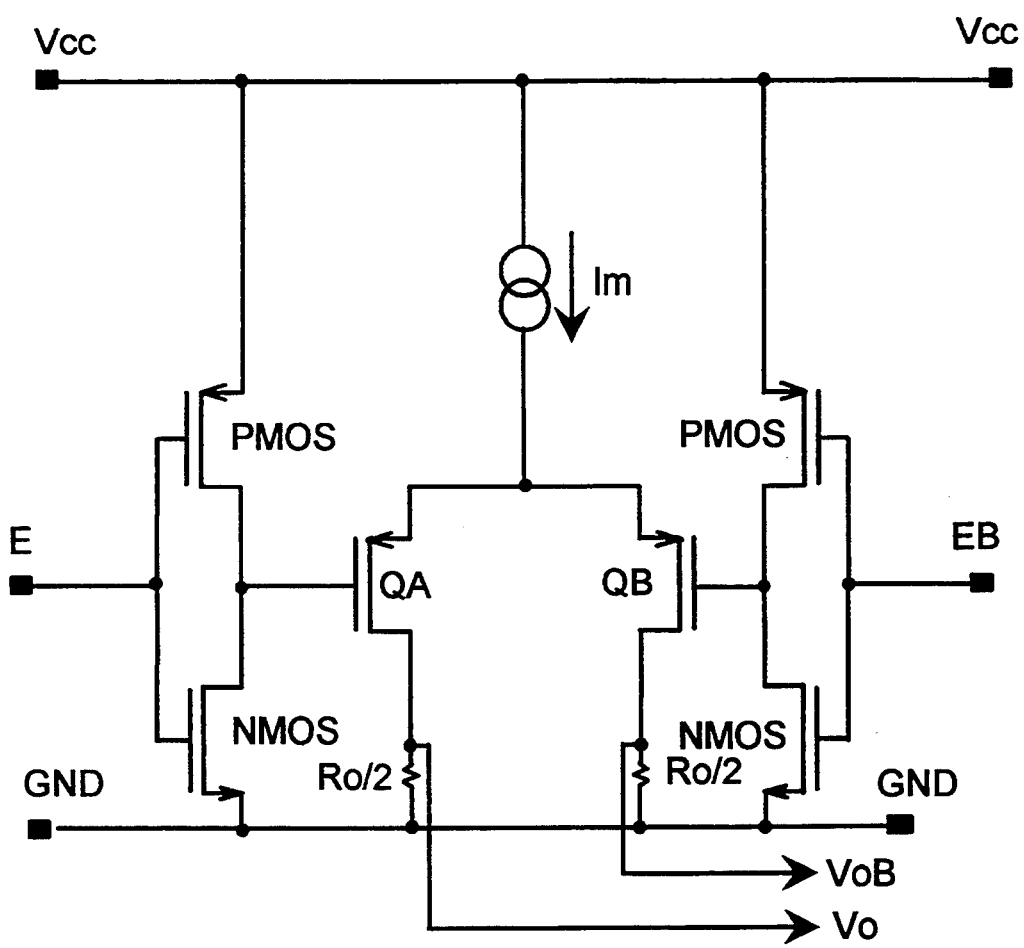
FIG. 2a (prior art) A prior-art MOS-based switch/driver.
Figure 2B:
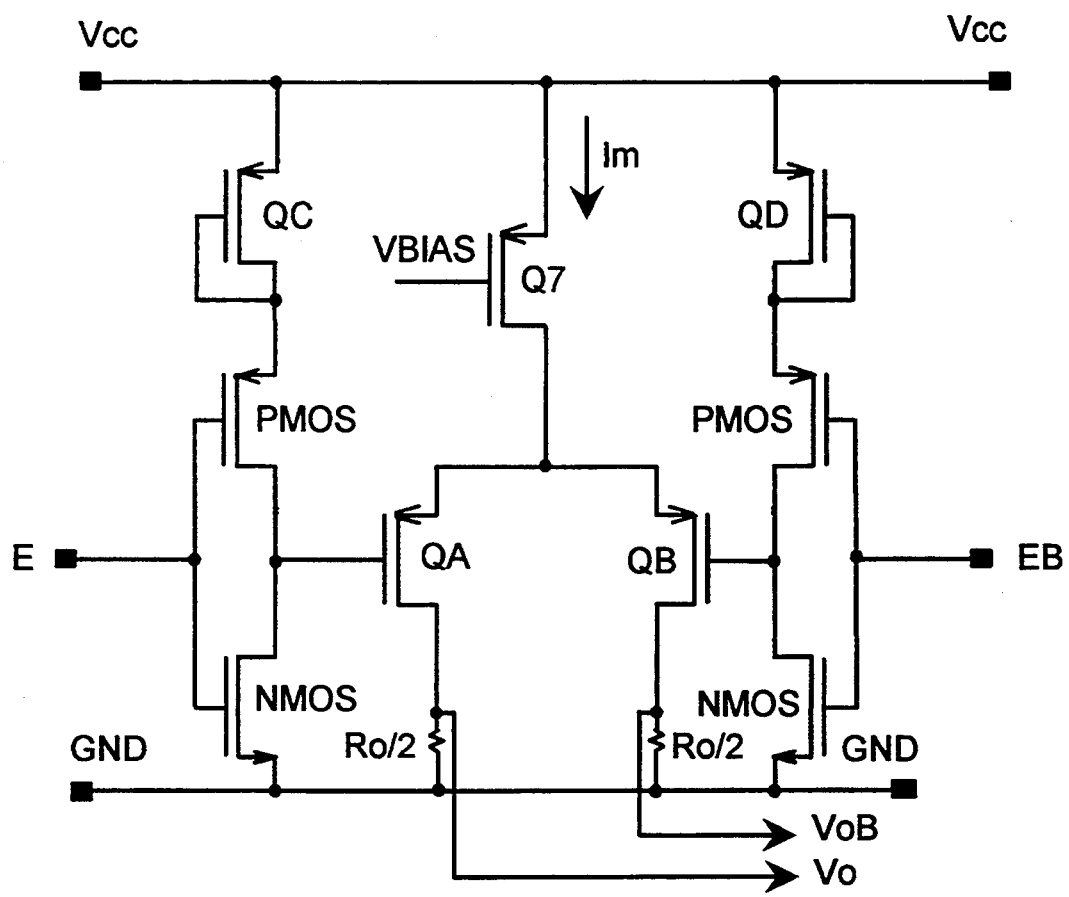
FIG. 2b (prior art) A prior-art MOS-based switch/driver similar to that shown in FIG. 2b, but with devices introduced to reduce the voltage swing at the gates of the output transistors.
Figure 3A:
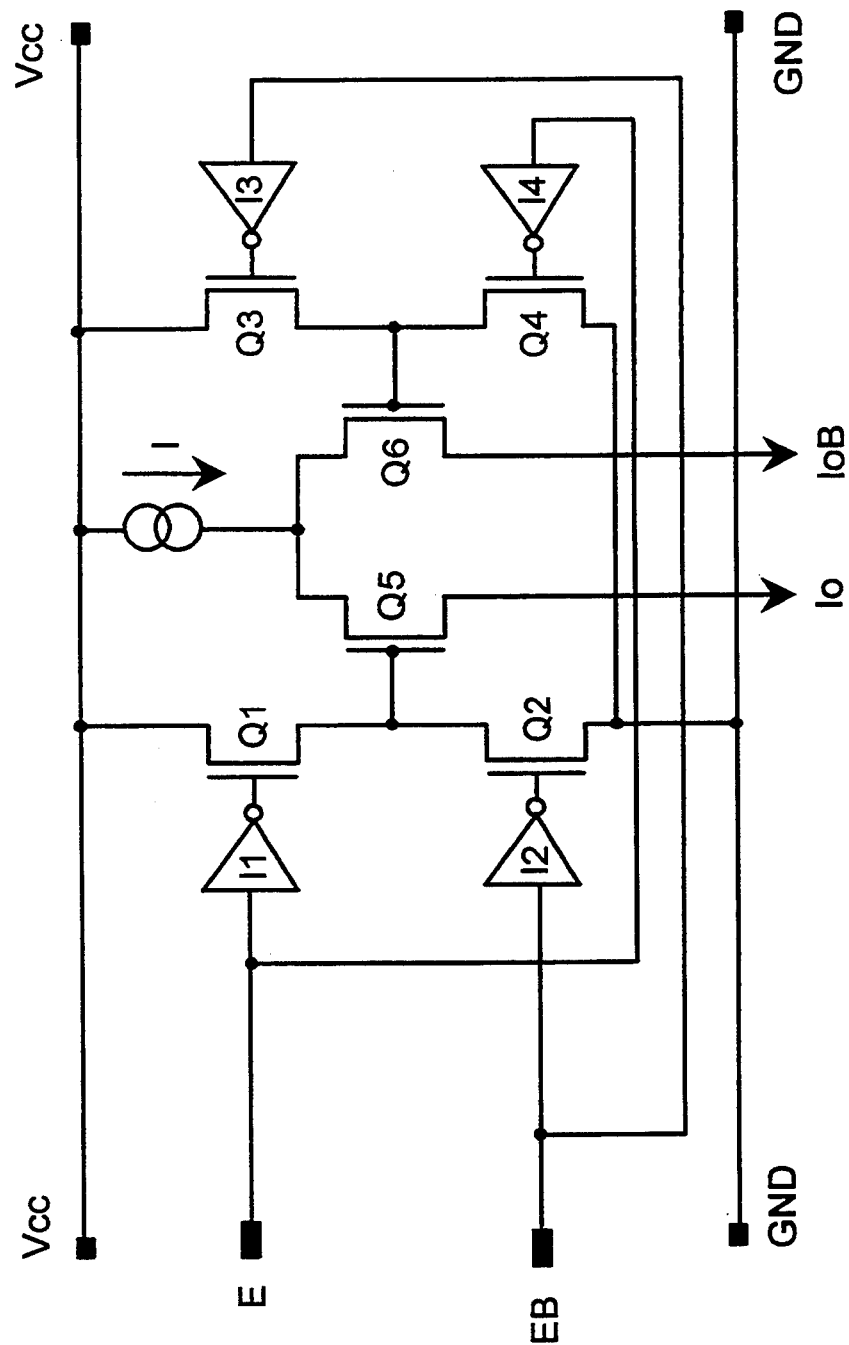
FIG. 3a General circuit for the MOS-based individual switch/driver circuit of the present invention.
Figure 3B:
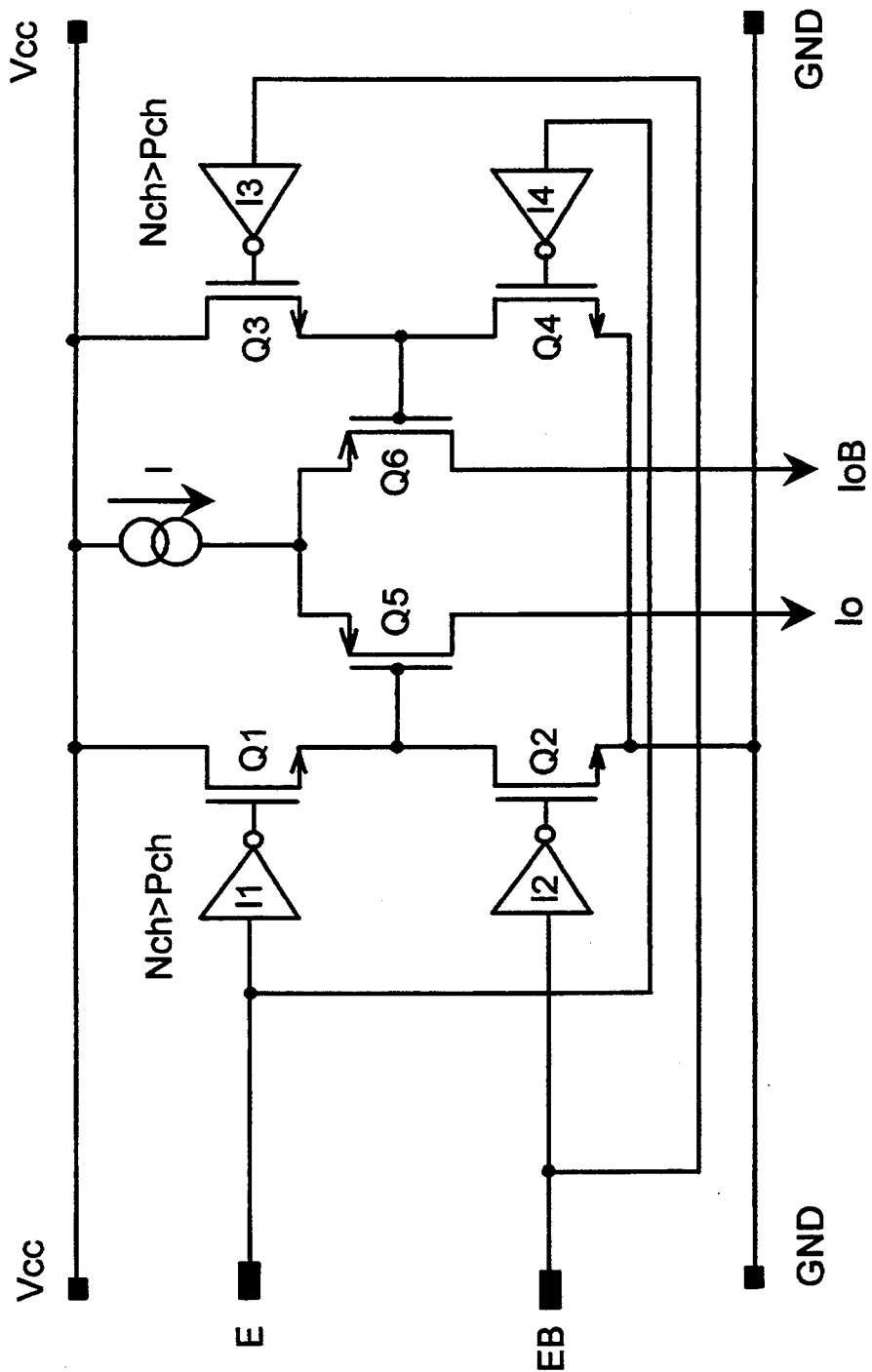
FIG. 3b Particular embodiment of the individual switch/driver of the present invention.

The individual switch/driver of the present invention is shown in FIG. 3a. It is MOS-based and operates by switching a constant current (I)—a current independent of temperature, power-supply-voltage variations, and manufacturing process vagaries-into one or the other of two output branches, Io and IoB. The constancy of this current is ensured by known means and is effected externally to the circuit shown in FIG. 3a. The switching is achieved by turning the respective output transistors Q5 and Q6 on and off. (It is understood that in operation the current output nodes, Io and IoB, will be coupled to ground through off-chip resistors, typically 50-ohm resistors.) The central concept of this new circuit is the means by which the MOS transistors Q5 and Q6 are controlled so as to overcome the on/off switching asymmetries inherent in the use of MOS output transistors. The voltage at the control gate of each is mediated by a pair of MOS transistors. Each pair of MOS transistors is in turn controlled by specially-designed NMOS/PMOS inverters, I1 through I4.

Transistors Q2 and Q4 allow the gate of either Q5 or Q6 to pull to GND while the Q1, Q3 pair alternately pull the gates of either Q5 or Q6 to $V_{cc}$ (minus the threshold voltage). This in effect reduces the voltage swing since Q1 and Q3 have high $V_TS$ due to the "back body" effect. Though reduced, this voltage swing is large enough to maintain sufficient margin for an excellent on-to-off current ratio. The crux of the invention lies in the way that the inverters I1 through I4 are designed. Contrary to the usual goal of ensuring that the CMOS output signal will have the same shape (though inverted) as its input signal—a goal generally accomplished by fabricating the inverter's PMOS transistor with a wider channel than its NMOS transistor—the goal here is to produce a distorted CMOS output. It is to be anticipated that the input signal and signal complement on E and EB will be symmetric pulses. In the present invention, the inverters I1 through I4 are skewed so as to produce responsive output signals which are distorted so as to compensate for the inherent asymmetries of Q5 and Q6. In this manner, symmetric inputs to E and EB will result in symmetric output current pulses at Io and IoB.

Figure 4:
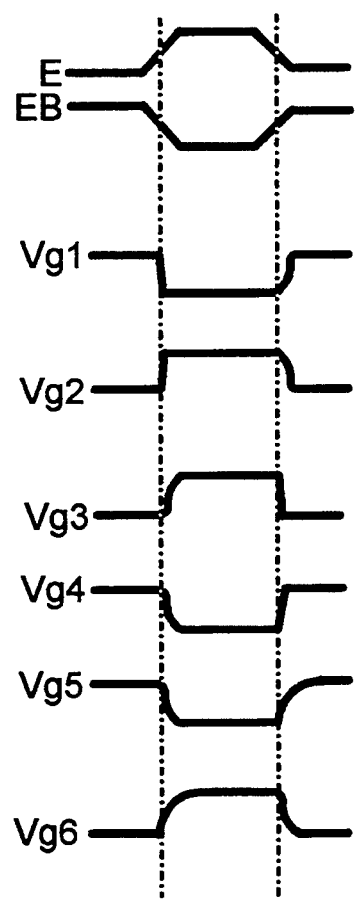
FIG. 4 Voltage at various nodes in the present invention's individual switch/driver as shaped by the output-transistor-control-circuit in response to a pulsed input signal input to circuit of FIG. 3b.

The present invention can be better understood by examination of a particular embodiment, one in which Q5, Q6 are PMOS transistors and in which the four control transistors Q1, Q2, Q3, and Q4 are NMOS transistors—all as demonstrated in FIG. 3b. For such a configuration, inverters I1 and I3 are designed to deliver a fast H→L transition and a slow L→H transition to the gates of Q1 and Q3. Conversely inverters I2 and I4 are designed to deliver fast L→H and slow H→L transitions to the gates of Q2 and Q4. In addition, Q2 and Q4 have significantly higher gain than their pull-up complements Q1 and Q3. This combined action results in the shaped drive signals needed to produce a symmetric switch of current from the I port to the IB port. FIG. 4 shows the pulse-shaping which the new output-driver-control circuit of FIG. 3b must effect. It shows that the signal and signal complement input to E and EB respectively are symmetric pulses with a certain rise time. $V_{gi}$ (i=1, 2, 3, 4, 5, or 6) is the voltage at the control node of transistor Qi resulting from these E, EB inputs. Note in particular that the pulses which are input to the two transistors Q5 and Q6 have rise-times that are long in comparison with their fall-times. It is found that this results in symmetric switching of current from Io to Iob in this circuit. It compensates for the differences between the turn-on and turn-off curves for Q5 and Q6 (and MOS transistors in general) which would otherwise occur.

The differential and common-mode-output transient responses for the current switch/driver of FIG. 3b are found to be greatly improved over the prior art. In practice, the current and current-complement outputs of a single driver would be coupled to ground through off-chip 50-ohm resistors and the resulting voltage pulses coupled to the transmission line via an isolation transformer.

Controlled-Transition-Time Generation

Figure 5:
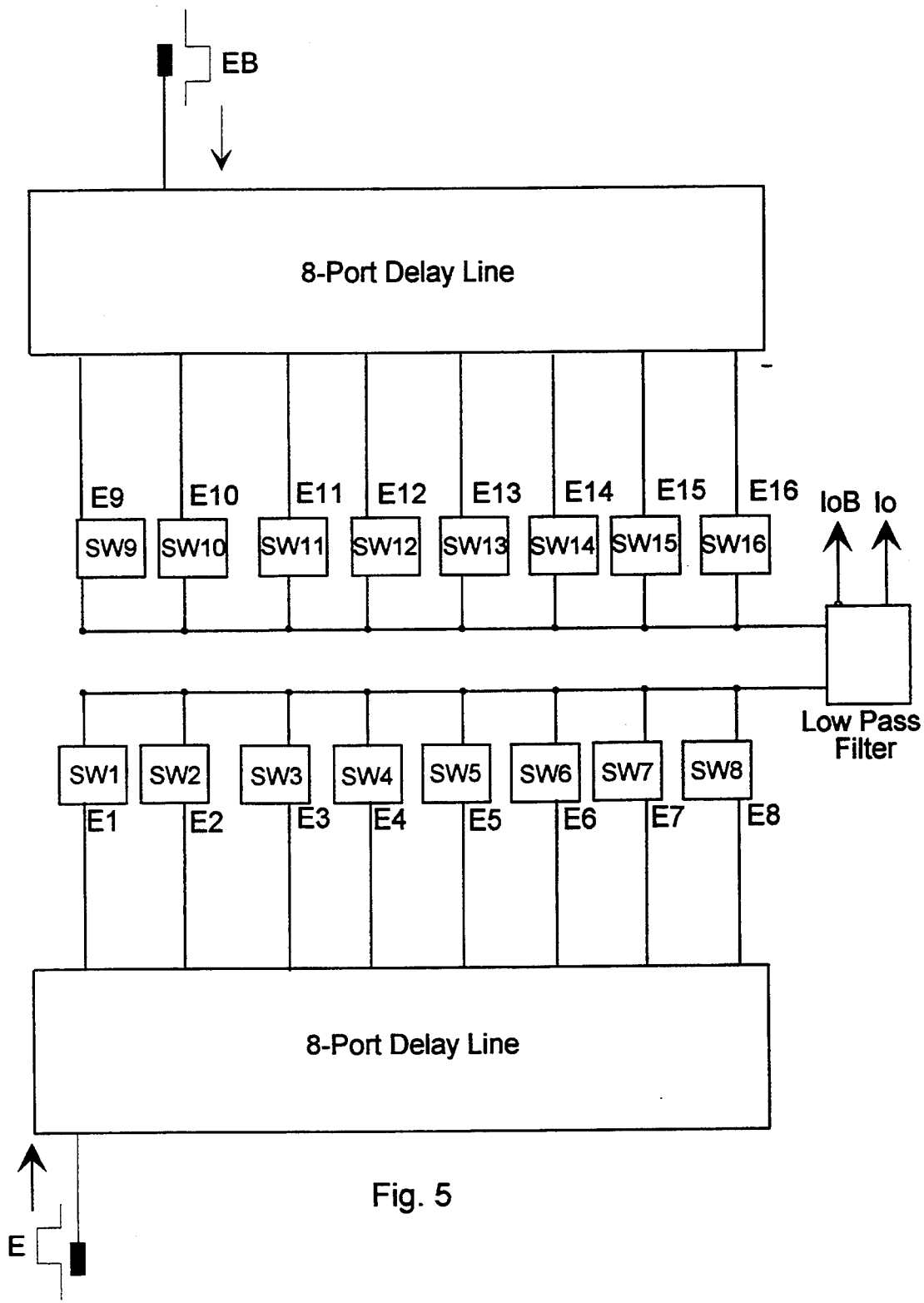
FIG. 5 Double array of individual switch/drivers of the present invention coupled with tapped delay lines so as to be capable produce a composite current pulse output with extended rise- and fall-times.
Figure 6:
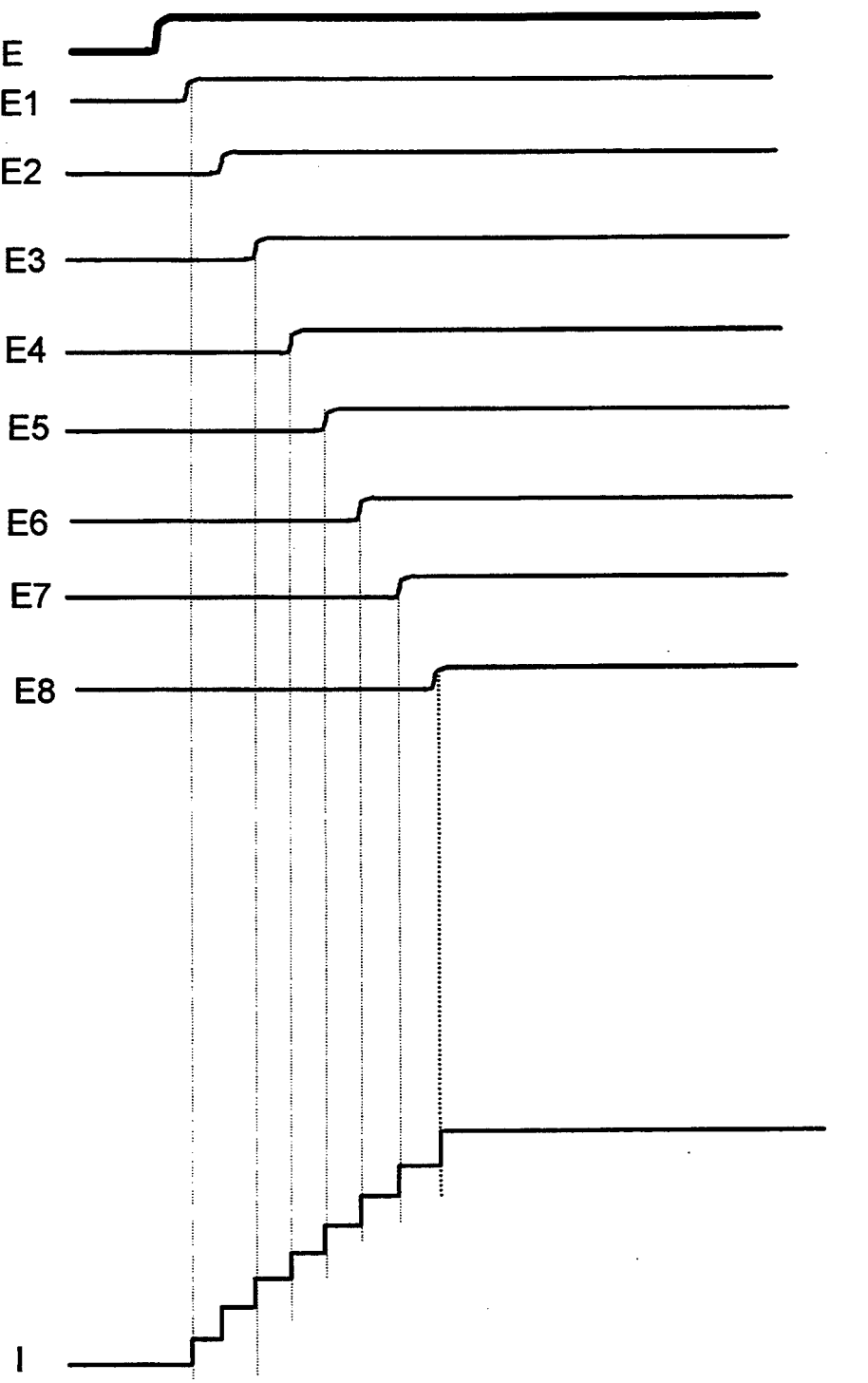
FIG. 6 Illustration of the delayed input sequence and the associated composite output pulse produced by the array set out in FIG. 5.

The present invention couples the individual switch/drivers described above in such a manner that composite pulses with controlled rise- and fall-times can be generated. In this manner it makes it possible to prolong the rise- and fall-times to the extent that transient aberrations are largely eliminated. In particular, if the pulse transitions are stepped so that approximately 2 nsec are required for the output to change from logic low to logic high, the desired EMI reduction follows. The individual delay steps, greater for each successive pulse generator to turn on, are provided by stepped delay lines, as shown schematically in FIG. 5, where each switch pair SW1/SW9, SW2/SW10, SW3/SW11, and so on, represents a switch/driver of the present invention, as described above. (Each individual switch/driver is shown schematically as two separate switch units, corresponding to the portion that processes the input E to produce an output $I_o$ and the complementary portion that processes the input EB to produce an output $I_oB$, respectively, all as shown in FIG. 3a and FIG. 3b.). FIG. 5 depicts the general technique with eight steps or stages used to obtain the current output Io from the input signal E and similarly for Iob and EB. There is, however, no upper or lower bound to the number of steps that can be used. FIG. 6 depicts how a voltage pulse input at E is delivered in time-stepped fashion to the inputs of the eight switch/drivers; it also depicts the resulting output current pulse. An identical arrangement delivers EB to the complementary portions of the eight switch/drivers. Simple filtering is used following this double array, so that the resultant pulses have smooth rise and fall characteristics, with a total time on the order of 2 nsec.

As indicated, I1 and I3 are designed so that the "normal" skewing between the PMOS and NMOS transistors is exacerbated by making the P-channel narrower than the N-channel. For the fabrication process of the Assignee of this application, the proper P/N skewing is obtained by: (a) providing for inverter I1 a PMOS transistor having a channel width about 60% the channel width of its NMOS transistor; (b) providing for inverter I2 a PMOS transistor having a channel width about 220% that of its NMOS transistor. The other pair of inverters is identical (i.e., I3 is identical to I1 and I4 to I2). This ensures that the outputs of inverters I1 and I3 make the H→L transition much faster than they make the L→H transition, as shown in FIG. 4. For inverters I2 and I4, on the other hand, the sizes of the P-channel and the N-channel are skewed so as to correct for the natural skewing. (The channel length is 1.0μ for all the transistors in the Preferred Embodiment except for the NMOS driver-transistors for which it is 1.3μ.)

Note that though they have the same channel length, the NMOS drivers for each of the two output transistors Q5 and Q6 shown in FIG. 7 have different channel widths. In particular, both Q1 and Q3 have channel widths of 45% the channel widths of Q2 and Q4. This ensures the greater gain which the lower driver transistors need for the pulse shaping called for in the present invention. The relatively narrow channels for Q1 and Q3 also ensure a significant voltage drop between $V_{cc}$ and the gate voltage of transistor Q5 when the latter is turned on. This in turn leads to a reduced voltage swing and consequently to reduced pickup on the output leads.

Tests of the Preferred Embodiment of the present invention carried out with a double-terminated 100-ohm balanced load scaled up by a factor of 32 (tests carried out in anticipation that an actual application of the current driver cell would use an array of 32 cells to accomplish the high current drive) revealed that the reduced voltage swing reduces the common mode noise output by about a factor of two. The introduction of the preshaped drive signal combined with the reduced voltage swing improves the common mode output by better than a factor of ten. This improvement is also maintained over a wide temperature and supply voltage range. Furthermore these test results indicate that the circuit does not suffer from duty-cycle distortion and that it does exhibit excellent performance at data transfer rates up to at least 160 MBPS. Finally, the simulated results demonstrate that the Preferred Embodiment of the present invention can be scaled down to a finer geometry, with channel lengths less than or equal to 0.8μ, with no material loss in performance.

Figure 8:
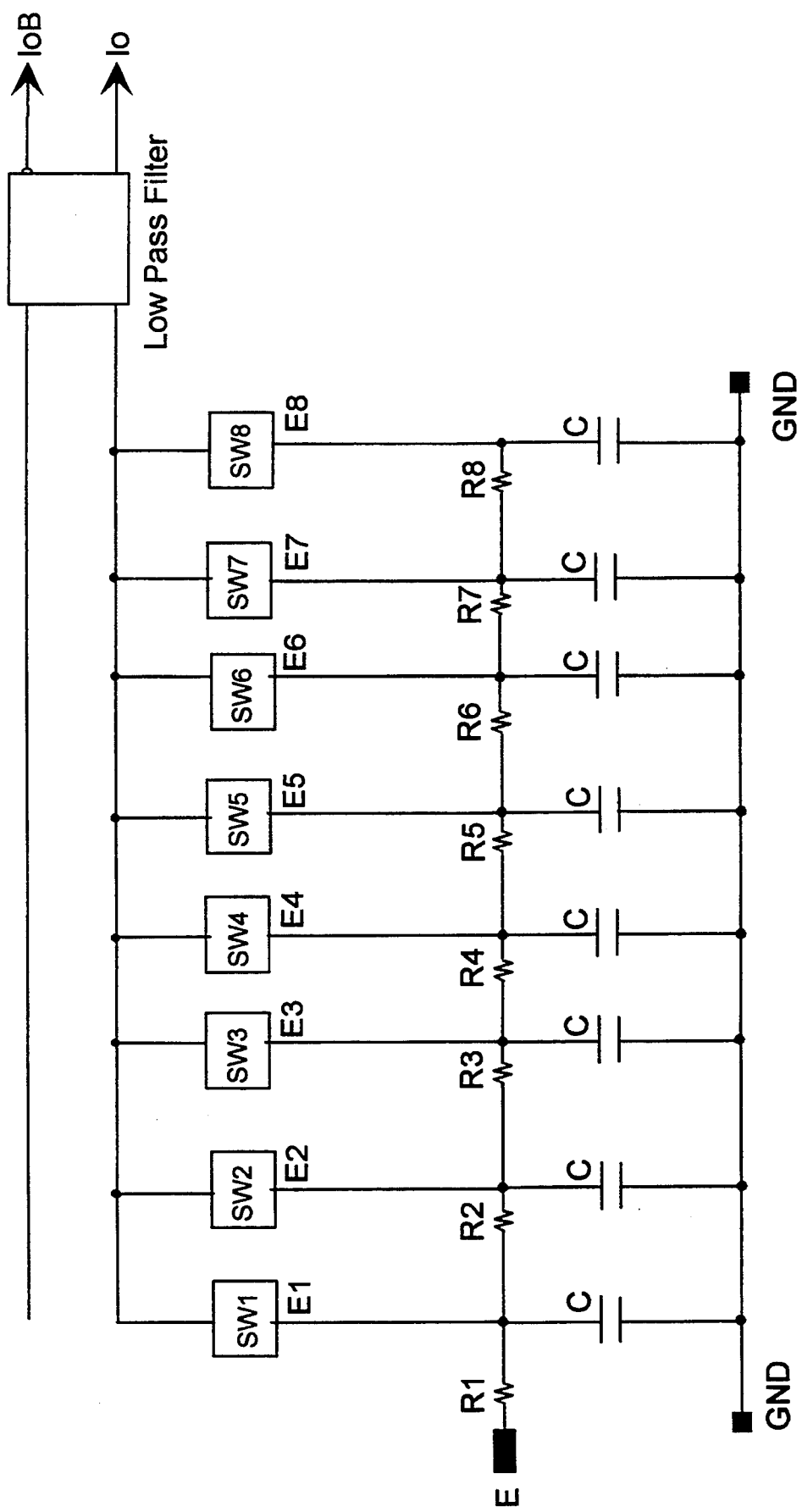
FIG. 8 Schematic of the delay line according to the Preferred Embodiment of the present invention.

The earlier discussion directed to the embodiment of the invention shown in FIGS. 3a and 3b sets out in a general manner the way in which the present invention combines an array of the individual switch/drivers with a tapped delay line in order to achieve control over the ramp times of the output signals without having to resort to filters which would distort the output impedance seen by the transmission line. FIG. 8 shows the way in which the delayed and stepped inputs are achieved in the Preferred Embodiment of the invention for the E input side of the switch/driver pairs shown in FIG. 5. The delay at each successive switch/driver input is provided by an RC time constant, where the "C" is depicted by an explicit capacitor but is in fact simply the input capacitance for switch/driver. (Clearly, one also has the option of adding capacitance in the manner shown.) By selecting the appropriate resistors for the array the rise and fall curves of the resulting pulses can be made to follow any desired monotonic shape. Note that because of the role played by the delayed switching, the particular shape is not crucial; all that is required is that the total rise and fall times be prolonged by the factor set out earlier. Thus, although the calculation of the specific resistances required for a particular composite edge function can be tedious (though within the ability of one skilled in the art) it is easy to determine the approximate resistors to be used; for the application desired, the approximate values are sufficient. In the Preferred Embodiment, linear rising and falling edges of the composite pulses are obtained by using the resistor sequence: R1=500 ohms, R2=571 ohms, R3=667 ohms, R4=800 ohms, R5=1000 ohms, R6=1333 ohms, R7=2000 ohms, and R8=4000 ohms. This is for an effective input capacitance of approximately 0.1 pF at each switch/driver.

Given a composite rise-time of 250 ps, the effective sampling rate for an equivalent sampled system would be 4.0 GHz. Combined with the 25-ohm resistance of a doubly terminated 50-ohm transmission system (or 100-ohm balanced), a stray capacitance of 5 pf will create a 1.27 GHz low pass filter and will attenuate the sampling frequency by 10.8 db. In addition, other factors such as limited isolation transformer bandwidth (which, in the case of the twisted-pair transmission, is on the order of 350 MHz) will further smooth the waveform.

It is clear that a wide range of embodiments can be achieved by one skilled in the art. The Preferred Embodiment set out here is just one of these embodiments—though the best for accomplishing the ends of the present inventor—and is not intended to be limiting in any way.

I claim:

1. Switch/driver apparatus for outputting a ground-referenced current and a ground-referenced current complement, said switch/driver comprising
    (a) a MOS output-transistor coupled between a constant current source and a current output node,
    (b) a MOS output-complement-transistor coupled between said constant current source and a current complement output node,
    (c) a voltage input node coupled to said output-transistor and to said output-complement-transistor,
    (d) a voltage complement input node coupled to said output-transistor and to said output-complement-transistor,
    (e) circuit control means for causing said output-transistor to deliver to said current output node an output current proportional to an input voltage signal applied to said voltage input node, wherein said circuit control means compensates for on/off switching asymmetries inherent in MOS transistors.

2. Apparatus as described in claim 1 wherein said circuit control means includes
    (a) an upper output-transistor-driver-transistor coupled between a high-potential power rail and a control node of said output-transistor,
    (b) a lower output-transistor-driver-transistor coupled between said control node of said output-transistor and a low-potential power rail, and
    (c) a first inverter and a second inverter
wherein said first inverter includes a first-inverter input coupled directly to said input node and a first-inverter output coupled directly to a control node of said upper output-transistor-driver-transistor, and wherein said second inverter includes a second-inverter input coupled directly to said voltage complement input and a second-inverter output coupled directly to a control node of said lower output-complement-transistor-driver-transistor.

3. Apparatus as described in claim 2 wherein said first inverter is a CMOS stage with a first-inverter PMOS channel and a first-inverter NMOS channel and said second inverter is a CMOS stage with a second-inverter PMOS channel and a second-inverter NMOS transistor.

4. Apparatus as described in claim 3 wherein said upper output-transistor-driver-transistor and said lower output-transistor-driver transistor are NMOS transistors.

5. Apparatus as described in claim 4 wherein said output-transistor and said output-complement-transistor are both PMOS transistors.

6. Apparatus as described in claim 5 wherein said first-inverter PMOS channel is smaller than said first-inverter NMOS channel and wherein second-inverter PMOS channel is larger than said second-inverter NMOS channel.

7. Apparatus as described in claim 6 wherein said first-inverter PMOS channel is approximately 60% as wide as said first-inverter NMOS channel and wherein said second-inverter NMOS channel is approximately 50% as wide as said second-inverter PMOS channel.

8. MOS-transistor-based differential current-switching apparatus comprising
    (a) a constant current source,
    (b) an output-transistor,
    (c) an output-complement-transistor with a common source node with said output-transistor,
    (d) a voltage input terminal,
    (e) a voltage complement input node,
    (f) a current output node coupled to said constant current source through said output-transistor, and
    (g) a current complement output node coupled to said constant current source through said output-complement-transistor,
    (h) an output-transistor-driver circuit comprising a first NMOS output-driver-transistor coupled between a high-potential power rail and a control node of said output-transistor, and a second NMOS output-driver-transistor coupled between said control node of said output-transistor and a low-potential power rail, (i) an output-complement-transistor-driver circuit comprising a first NMOS output-complement-driver-transistor coupled between said high-potential power rail and a control node of said output-complement-transistor, and a second NMOS output-complement-driver-transistor coupled between said control node of said output-complement-transistor and said low-potential power rail, (j) a first inverter coupled between said voltage input node and a control node of said first NMOS output-driver-transistor, (k) a second inverter coupled between said voltage complement input node and a control node of said second NMOS output-driver-transistor, (l) a third inverter coupled between said voltage complement input node and a control node of said first NMOS output-complement-driver-transistor, (m) a fourth inverter coupled between said voltage input node and a control node of said second NMOS output-complement-driver-transistor, wherein said first inverter is a CMOS stage inverter comprising a first-inverter-PMOS-transistor coupled directly to said high-potential power rail and coupled to said low-potential power rail through a first-inverter-NMOS-transistor, wherein said first-inverter-PMOS-transistor has a first-inverter-P-channel-width and said first-inverter-NMOS-transistor has a first-inverter-N-channel-width, wherein said first-inverter-P-channel-width is much smaller than said first-inverter-N-channel-width, wherein said second inverter is a CMOS stage inverter comprising a second-inverter-PMOS-transistor coupled directly to said high-potential power rail and coupled to said low-potential power rail through a second-inverter-NMOS-transistor, wherein said second-inverter-PMOS-transistor has a second-inverter-P-channel-width and said second-inverter-NMOS-transistor has a second-inverter-N-channel-width, wherein said second-inverter-P-channel-width is much larger than said second-inverter-N-channel-width, wherein said third inverter is identical to said first inverter and wherein said fourth inverter is identical to said second inverter.

9. Apparatus as described in claim 8 wherein said first-inverter-P-channel-width is approximately 60% as large as said first-inverter-N-channel-width and wherein said second-inverter-P-channel-width is approximately 220% as large as said second-inverter-N-channel-width.

* * * * *